(12) United States Patent
Chehab et al.

(10) Patent No.: US 12,557,378 B2
(45) Date of Patent: Feb. 17, 2026

(54) COMPLEMENTARY FIELD-EFFECT TRANSISTOR DEVICE

(71) Applicant: IMEC VZW, Leuven (BE)

(72) Inventors: Bilal Chehab, Leuven (BE); Pieter Schuddinck, Nieuwerkerken (BE); Julien Ryckaert, Schaerbeek (BE); Pieter Weckx, Bunsbeek (BE)

(73) Assignee: Imec vzw, Leuven (BE)

( * ) Notice: Subject to any disclaimer, the term of this patent is extended or adjusted under 35 U.S.C. 154(b) by 585 days.

(21) Appl. No.: 18/060,785

(22) Filed: Dec. 1, 2022

(65) Prior Publication Data

US 2023/0178554 A1 Jun. 8, 2023

(30) Foreign Application Priority Data

Dec. 2, 2021 (EP) .................................... 21211959

(51) Int. Cl.
*H01L 27/092* (2006.01)
*H01L 23/528* (2006.01)
(Continued)

(52) U.S. Cl.
CPC ......... *H10D 84/856* (2025.01); *H01L 23/528* (2013.01); *H10D 30/43* (2025.01); *H10D 30/6735* (2025.01); *H10D 62/121* (2025.01)

(58) Field of Classification Search
CPC .. H10D 84/856; H10D 30/43; H10D 30/6735; H10D 62/121; H10D 64/518;
(Continued)

(56) References Cited

U.S. PATENT DOCUMENTS

2019/0172828 A1\* 6/2019 Smith ................... H10D 88/00
2019/0393214 A1 12/2019 Lilak et al.
(Continued)

OTHER PUBLICATIONS

Extended European Search Report and Written Opinion, Application No. EP 21211959.8, mailed May 16, 2022, 13 pages.
(Continued)

*Primary Examiner* — Tong-Ho Kim
(74) *Attorney, Agent, or Firm* — McDonnell Boehnen Hulbert & Berghoff LLP

(57) ABSTRACT

Example embodiments relate to complementary field-effect transistor (CFET) devices. An example CFET device includes a bottom FET device. The bottom FET device includes a bottom channel nanostructure having a first side surface oriented in a first direction. The bottom FET device also includes a second side surface oriented in a second direction opposite the first direction. Further, the bottom FET device includes a bottom gate electrode configured to define a tri-gate or a gate-all-around with respect to the bottom channel nanostructure. The bottom gate electrode includes a side gate portion arranged along the first side surface of the bottom channel nanostructure. The CFET device also includes a top FET device stacked on the bottom FET device. The top FET device includes channel layers, a gate electrode, and gate prongs. Additionally, the CFET device includes a top gate contact via. Further, the CFET device includes a bottom gate contact via.

20 Claims, 6 Drawing Sheets

(51) Int. Cl.
    *H01L 29/06*     (2006.01)
    *H01L 29/423*     (2006.01)
    *H01L 29/775*     (2006.01)
    *H10D 30/43*     (2025.01)
    *H10D 30/67*     (2025.01)
    *H10D 62/10*     (2025.01)
    *H10D 84/85*     (2025.01)

(58) Field of Classification Search
    CPC ...... H10D 84/85; H10D 84/853; H10D 88/00; H10D 84/0186; H10D 84/0179; H10D 84/038; H10D 88/01; H01L 23/528; B82Y 10/00
    USPC .......................................................... 257/351
    See application file for complete search history.

(56) References Cited

U.S. PATENT DOCUMENTS

| | | | |
|---|---|---|---|
| 2020/0075574 A1* | 3/2020 | Smith | B82Y 10/00 |
| 2021/0082766 A1* | 3/2021 | Miura | H10D 84/038 |
| 2021/0296500 A1* | 9/2021 | Chan | H10D 64/017 |

OTHER PUBLICATIONS

Spessot, Alessio, Bertrand Parvais, Amita Rawat, Kenichi Miyaguchi, Pieter Weckx, Doyoung Jang, and Julien Ryckaert. "Device Scaling roadmap and its implications for Logic and Analog platform." In 2020 IEEE BiCMOS and Compound Semiconductor Integrated Circuits and Technology Symposium (BCICTS), pp. 1-8. IEEE, 2020.

* cited by examiner

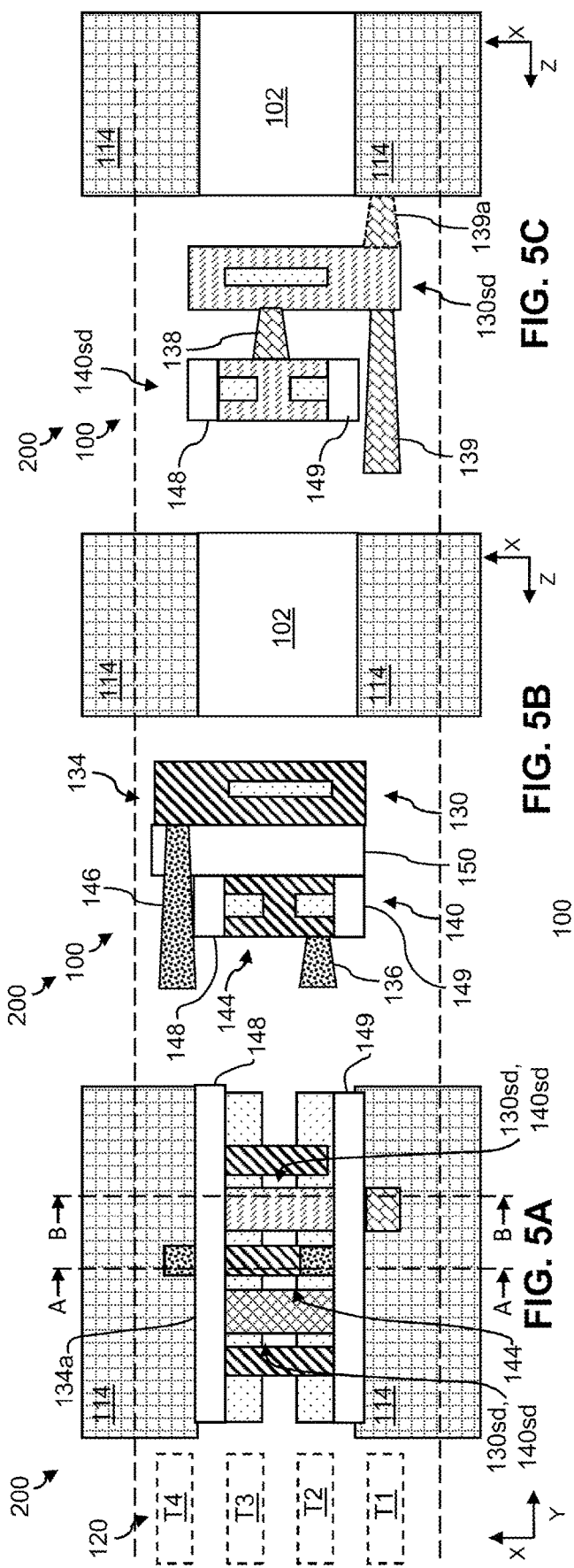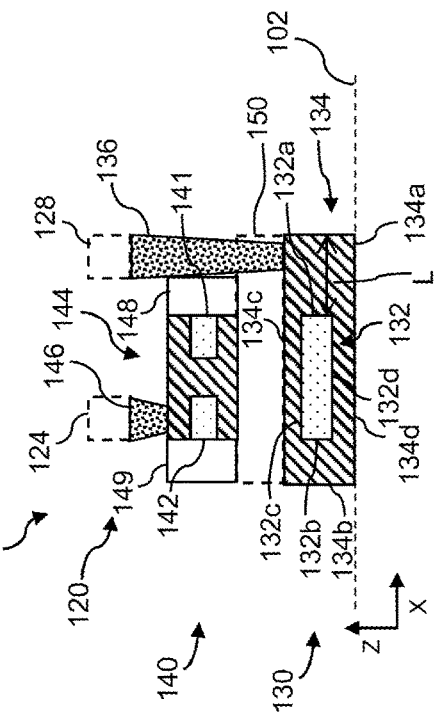
FIG. 5A  FIG. 5B  FIG. 5C  FIG. 5D

COMPLEMENTARY FIELD-EFFECT TRANSISTOR DEVICE

CROSS-REFERENCE TO RELATED APPLICATIONS

The present application is a non-provisional patent application claiming priority to European Patent Application No. EP 21211959.8, filed Dec. 2, 2021, the contents of which are hereby incorporated by reference.

FIELD OF THE DISCLOSURE

The present disclosure relates to a Complementary Field-Effect Transistor (CFET) device.

BACKGROUND

Modern semiconductor device processing involves designing integrated circuits comprising a great number of standardized unit cells ("standard cells") comprising a combination of active devices, such as transistors. Intra- and inter-cell signal routing between active devices may be provided by an interconnect structure comprising e.g. a set of conductive lines and vias. Standard cells may be designed to provide certain functionality, logic functions, storage functions or the like. In standard cell methodology, the designer may accordingly combine cells from a library of standard cells to design a circuit with desired functions.

The conductive lines of an interconnect structure for a standard cell may be formed along a respective one of a set of parallel "routing tracks", typically having a uniform width and pitch.

As integrated circuits continue to become smaller and smaller and simultaneously comprise an increasing number of semiconductor devices within a given area, there is a strive for reducing the size of the standard cells, among others by reducing the "track height" of the cell, i.e. the number of routing tracks per cell.

In the Complementary Field-Effect Transistor (CFET) device a complementary pair of FETs are stacked on top of each other (e.g. an NMOS/nFET device stacked on top of a PMOS/pFET device). The CFET allows a reduced footprint compared to a traditional side-by-side arrangement of a pFET and nFET. The two device levels provided by the CFET (e.g. a "2-level middle-of line/MOL") further enables a reduced routing layer usage (e.g. in the back-end-of line/BEOL). The CFET hence facilitates realization of low track height cells such as 4-track (4T) cells.

A CFET device may be formed using a monolithic approach and a sequential approach. A "monolithic CFET" may comprise a gate electrode which is physically and electrically common (i.e. a monolithic gate electrode) to the top and bottom device. Meanwhile, a "sequential CFET" allows separate gate electrodes for the top and bottom devices.

SUMMARY

According to first aspect of the present disclosure, there is provided complementary field-effect transistor, CFET, device comprising:
- a bottom FET device and a top FET device stacked on top of the bottom FET device,
    - the bottom FET device comprising a bottom channel nanostructure having a first side surface oriented in a first direction and a second side surface oriented in a second direction opposite the first direction, and a bottom gate electrode configured to define a tri-gate or a gate-all-around with respect to the bottom channel nanostructure, the bottom gate electrode comprising a side gate portion arranged along the first side surface of the bottom channel nanostructure, and
    - the top FET device comprising a first channel layer and a second channel layer spaced apart along the first direction, and a top gate electrode configured to define a tri-gate with respect to each of the first and second channel layers and comprising a common gate portion arranged between the first and second channel layers, and a pair of first gate prongs protruding from the common gate portion in the first direction such that the first channel layer is arranged between the first gate prongs, and a pair of second gate prongs protruding from the common gate portion in the second direction such that the second channel layer is arranged between the second gate prongs,
    - wherein the side gate portion of the bottom gate electrode defines a via contact portion protruding outside the top gate electrode and the first channel layer of the top FET device; and
- a top gate contact via for coupling the top gate electrode to a first conductive line over the top FET device and a bottom gate contact via for coupling the via contact portion of the bottom gate electrode to a second conductive line over the top FET device.

The CFET device according to the first aspect facilitates an independent contacting of the top and bottom gate electrodes, i.e. an independent gate pick-up. In particular, by the tri-gate configuration of the top gate electrode the via contact portion may protrude outside, i.e. with respect to, the top FET device, along the first direction, such that access to the via contact portion by the top gate contact via is allowed with minor or no area penalty. A risk of shorting between the top gate electrode and the bottom gate contact via may thus be mitigated.

As used herein, the term "gate-all-around" refers to a gate electrode extending to completely surround the channel structure. Accordingly, a gate-all-around configuration of the bottom gate electrode with respect to the bottom channel nanostructure implies that the bottom gate electrode extends along the first side surface, an upper surface, a lower surface and the second side surface of the bottom channel nanostructure.

As used herein, the term "tri-gate" refers to a gate electrode extending along exactly three surfaces of a channel structure (e.g. the first and second channel layers or the bottom channel nanostructure). Accordingly, the tri-gate configuration of the top gate electrode with respect to the each of the first and second channel layers implies that the top gate electrode extends along a respective inwardly facing side surface of the first and second channel layers, and along a respective upper surface and a respective lower surface of the first and second channel layers, but not along the respective outwardly facing side surfaces of the top channel nanosheet.

The tri-gate configuration of the top gate electrode thus enables a zero gate extension at each of the outwardly facing side surfaces of the first and second channel layers, which creates a space for the bottom gate contact via. In other words, the outwardly facing side surfaces of the first and second channel layers of the top FET device may define non-gated side surfaces.

As used herein, the term "gate prong" refers to a portion (e.g. layer-shaped) of the top gate electrode protruding in the first or second direction from the common gate body portion to a respective free end. The top gate electrode may thus have a fork-shaped design.

The CFET device of the first aspect confers a design flexibility in terms of type of bottom device, which as will be further described below e.g. may be either of a fin-based or a nanosheet-based FET.

The merits of the CFET device of the first aspect may be especially useful in low track height cell implementations and at aggressive line pitches, wherein the space available for the top gate contact via tends to be limited. It is however envisaged that the CFET device may be used in any context that has a CFET device with independent top and bottom gate pick-up.

As used herein, the term "CFET" refers to a device comprising a bottom FET device of a first conductivity type and a top FET device of a second opposite conductive type stacked on top of the bottom FET device, e.g. an n-type MOSFET (NMOSFET/nFET) stacked on top of a p-type MOSFET (PMOSFET/pFET) or vice versa. The top FET device may more specifically be arranged directly above the bottom FET device.

Relative spatial terms such as "top", "bottom", "upper", "lower", "vertical", "stacked on top of", "alongside" and "horizontal" are used to refer to locations or directions within a frame of reference of the CFET device. In particular, "top", "bottom", "upper", "lower", "vertical" and "stacked on top of" may be understood in relation to a bottom-up direction of the CFET device (i.e. a direction from the bottom FET device towards the top FET device), or equivalently in relation to a normal direction to a substrate of the CFET device, in particular a main plane of extension of the substrate. Correspondingly, the terms "alongside", "horizontal" and "lateral" may be understood as positions or orientations as viewed along a direction parallel to (the main plane of extension of) the substrate.

The wording a first structure arranged "directly above"/"directly underneath" a second structure refers to a relative positioning of the first and second structures such that the first/second structure at least partly overlaps the second/first structure as viewed along the bottom-up (i.e. normal) direction. The designation "direct" should hence not be construed as the first and second structures necessarily being arranged in abutment with each other, but rather as indicating the aforementioned geometric mutually overlapping relationship of the first and second structures.

According to some embodiments, the first and second channel layers of the top FET device may each be a nanosheet.

As used herein, the term "nanosheet" refers to a nanostructure having a width (along the first direction) to thickness (along the bottom-up direction) ratio greater than 1, e.g. 2 or greater. "Nanosheet" is in particular used to refer to a horizontally oriented nanosheet, e.g. parallel to a substrate of the CFET device.

Providing a top FET device with channel layers in the shape of nanosheets may enable a satisfactory level of channel control despite the zero gate extension along the outwardly facing side surfaces of the nanosheets. Additionally, nanosheets may enable an increased channel width, and hence an increased drive current.

In some embodiments, the CET device may comprise a vertically oriented insulating wall arranged alongside the top FET device, between the top FET device and the bottom gate contact via.

The insulating wall may physically and electrically separate the bottom gate contact via from the of the first pair of gate prongs and the first channel layer.

The insulating wall may have a first side surface oriented in the first direction and a second side surface oriented in the second direction, wherein the bottom gate electrode via may be aligned with the first side surface of the insulating wall. An outwardly facing/first side surface of the first channel layer oriented in the first direction may further be arranged to abut the second side surface of the insulating wall.

The insulating wall may thus facilitate ensuring a physical and electrical separation between the bottom gate contact via and the top gate electrode and the first channel layer, even at small critical dimension (CD) and line pitches.

The top FET device and the insulating wall may be embedded in an inter-layer dielectric material different from a material of the insulating wall. This may facilitate fabrication in that a via hole for the bottom gate contact via may be etched in the inter-layer dielectric material, selectively to and thus self-aligned with the insulating wall.

The CFET device may comprise a further (second) insulating wall arranged alongside the top FET device at an opposite side to the above-mentioned (first) insulating wall. The second insulating wall may have a first side surface oriented in the first direction and a second side surface oriented in the second direction. An outwardly facing/first side surface of the second channel layer oriented in the second direction may be arranged to abut the first side surface of the insulating wall. The second insulating wall may like the first insulating wall be embedded in an inter-layer dielectric material different from a material of the second insulating wall.

In some embodiments, the CFET device may further comprise a dielectric layer arranged between the bottom gate electrode and the top gate electrode, wherein the bottom gate contact via extends through the dielectric layer.

The top gate electrode and bottom gate electrode may thus be physically and electrically spaced apart from each other by the dielectric layer. Meanwhile, the via contact portion allows the bottom gate contact via to couple the second conductive line to the bottom gate electrode, by-passing the top gate electrode arranged directly above the bottom gate electrode.

In some embodiments, the first channel layer of the top FET device may be arranged directly above the bottom channel nanostructure. The top FET device may hence be stacked on top of the bottom FET device such that the first channel layer at least partly overlaps the bottom channel nanostructure, as viewed along a vertical direction.

In some embodiments, the bottom channel nanostructure may be a nanosheet.

Using a channel structure in the shape of a nanosheet also for the bottom FET device may enable an increased drive current and reduced height of the FET device.

The first channel layer and the second channel layer of the top FET device may be arranged directly above the bottom channel nanosheet. Each of the first channel layer and the second channel layer may thus at least partly overlap the bottom channel nanosheet, as viewed along a vertical direction.

The bottom gate electrode may be configured to define a gate-all-around with respect to the bottom channel nanosheet.

This may further improve channel control for the bottom FET device.

In some embodiments, the bottom channel nanostructure may be a first fin structure, wherein the bottom gate electrode may extend across the first fin structure to define a tri-gate with respect to the first fin structure.

The bottom FET device may hence be a fin-based FET, the fin structure being surrounded by a gate electrode along three surfaces (e.g. a pair of side surfaces and an upper surface).

The bottom FET device may further comprise a second fin structure arranged alongside the first fin structure, wherein the bottom gate electrode may extend across the first fin and second fin structures to define a tri-gate with respect to each of the first and second fin structures.

Two fin structures may thus be accommodated in the bottom FET device. A greater number of fin structures may enable an increased drive current of the bottom FET device.

The first channel layer may further be arranged directly above the first fin structure and the second channel layer may be arranged directly above the second fin structure.

This may further contribute to an area efficient design by minimizing an extension of the side gate portion of the bottom gate electrode along the first direction used to provide clearance for the bottom gate contact via with respect to the top gate electrode. It may further allow the two fin structures to be accommodated within the footprint of the two channel layers of the top FET device. An equal number of channel structures in the bottom and top FET device may further contribute to a uniform performance for the bottom and top FET device.

In some embodiments, the top FET device may comprise at least two vertically spaced apart first channel layers and at least two vertically spaced apart second channel layers, and the top gate electrode may comprise at least three first gate prongs protruding from the common gate portion in the first direction such that each first channel layer is arranged between a respective pair of first gate prongs, and at least three second gate prongs protruding from the common gate portion in the second direction such that each second channel layer is arranged between a respective pair of second gate prongs.

Two or more first and second channel layers in the top FET device may enable an increased active area, and hence support an increased drive current of the top FET device.

According to a second aspect, there is provided a circuit cell comprising:
  a CFET device according to the first aspect or any of the afore-mentioned embodiments or variations thereof; and
  an interconnect layer arranged over the top FET device and comprising the first and the second conductive line, wherein the first conductive line of the interconnect structure is arranged to extend along a first routing track of the circuit cell and the second conductive line of the interconnect structure is arranged to extend along a second routing track of the circuit cell, the first and second routing tracks extending in parallel along a third direction transverse to the first and second directions.

The circuit cell may in particular be a standard cell of a standard cell device, e.g. e.g. a logic cell or a memory cell.

In some embodiments the circuit cell may be a 4-track cell, the second routing track may be an edge track, and the first routing track may be located directly above the top gate electrode, wherein the side gate portion of the bottom gate electrode may protrude in the first direction such that the via contact portion is positioned directly underneath the first edge track.

The CFET device of the first aspect may hence be used to realize a 4T cell with independent top and bottom gate pick-up while mitigating a risk for shorting between the top gate electrode and the bottom gate contact via.

The first routing track may be non-edge track arranged directly above the top gate electrode.

Having the top gate pick-up from a non-edge track may allow a second edge track opposite the first edge track to be used e.g. for a source/drain contact via, as well as create a margin between the CFET device and an adjacent cell.

According to a third aspect, there is provided an integrated circuit comprising:
  a plurality of first circuit cells each in accordance with the second aspect or any of the afore-mentioned embodiments or variations thereof; and
  a plurality of second circuit cells each comprising a CFET device comprising bottom FET device and a top FET device stacked on top of the bottom FET device, the bottom FET device comprising a bottom channel nanostructure and a bottom gate electrode configured to define a tri-gate or a gate-all-around with respect to the bottom channel nanostructure, and
  the top FET device comprising a first channel layer and a second channel layer spaced apart along the first direction, and a top gate electrode configured to define a tri-gate with respect to each of the first and second channel layers and comprising a common gate portion arranged between the first and second channel layers, and a pair of first gate prongs protruding from the common gate portion in the first direction such that the first channel layer is arranged between the first gate prongs, and a pair of second gate prongs protruding from the common gate portion in the second direction such that the second channel layer is arranged between the second gate prongs,
  a bottom gate contact via extending between the common gate portion and the bottom gate electrode to couple the top gate electrode to the bottom gate electrode, and
  a top gate contact via coupling the top gate electrode to a third conductive line.

This enables CFET based circuit cells with independent gate pick-up (the first circuit cells) and electrically common gates (the second circuit cells) to be combined in a same integrated circuit. As may be appreciated, the circuit cells of the first and the second type may each be 4T standard cells, e.g. implementing different functionality.

In particular, the common gate body portion allows the gate-to-gate contact to be provided at a position between the first and second channel layers, thus enabling the gate-to-gate contact without requiring any increased side gate extension for the bottom gate electrode.

The embodiments and variations of the CFET device of the first aspect (hereinafter first CFET device) may apply in a corresponding manner to the CFET device of each second circuit cell (hereinafter second CFET device), excepting the discussion related to the independent gate pick-up, e.g. the bottom gate via contact portion. For example, the first and second channel layers of the second CFET device may be nanosheets. The nanostructure of the bottom FET device may be a nanosheet or a fin structure. The second CFET device may comprise a first and second insulating wall corresponding to the insulating walls described above. The second CFET device may further comprise a dielectric layer arranged between the bottom gate electrode and the top gate electrode, wherein the bottom gate contact via may extend through the dielectric layer.

BRIEF DESCRIPTION OF THE DRAWINGS

The above, as well as additional features may be better understood through the following illustrative and non-limiting detailed description, with reference to the appended drawings. In the drawings like reference numerals will be used for like elements unless stated otherwise.

FIG. 5A schematically illustrates a circuit cell comprising a CFET device, according to example embodiments.

FIG. 5B schematically illustrates a circuit cell comprising a CFET device, according to example embodiments.

FIG. 5C schematically illustrates a circuit cell comprising a CFET device, according to example embodiments.

FIG. 5D schematically illustrates a circuit cell comprising a CFET device, according to example embodiments.

DETAILED DESCRIPTION

FIGS. 1A-1D are provided by way of a comparative example and it is to be noted that the circuit cell 10 as shown therein is not intended as a representation of prior art. Rather, these figures are provided by way of example to illustrate certain design challenges in integrated circuit design based on CFETs, to thereby further elucidate the merits of a CFET device in accordance with example embodiments.

Figures 1A, 1B, 1C:
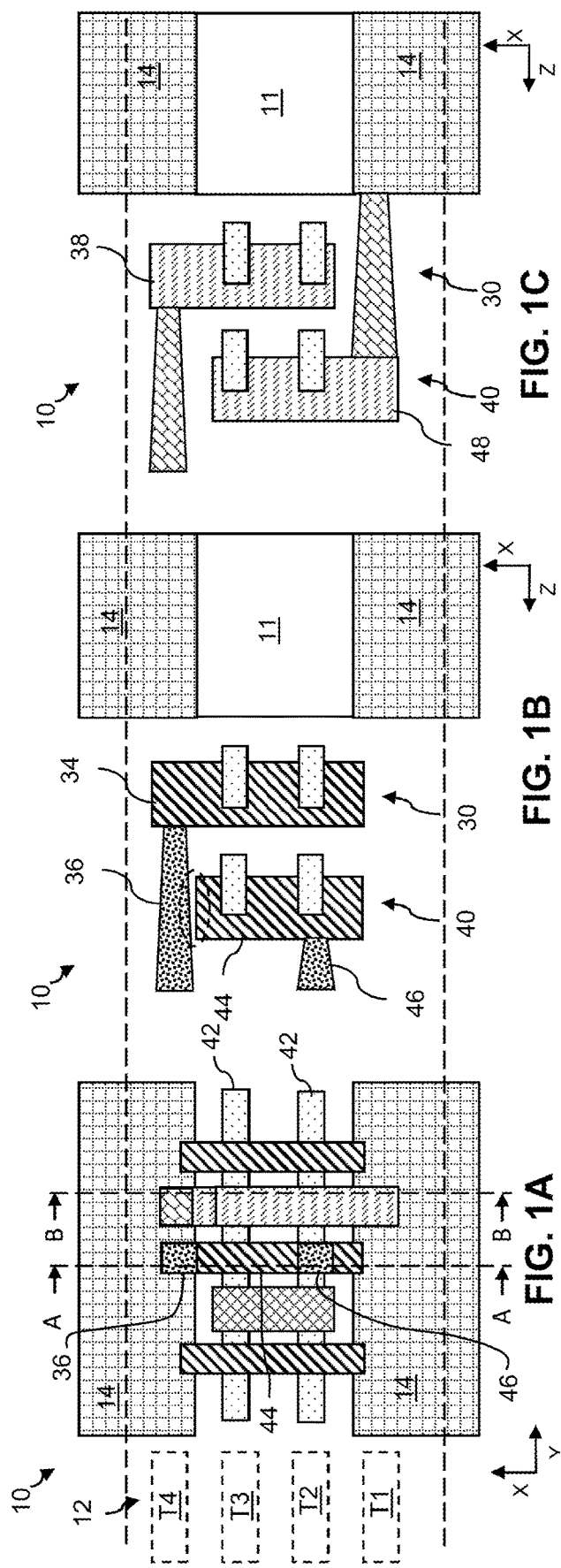
FIG. 1A schematically illustrates a comparative example of a circuit cell comprising a CFET device, according to example embodiments.
FIG. 1B schematically illustrates a comparative example of a circuit cell comprising a CFET device, according to example embodiments.
FIG. 1C schematically illustrates a comparative example of a circuit cell comprising a CFET device, according to example embodiments.
Figure 1D:
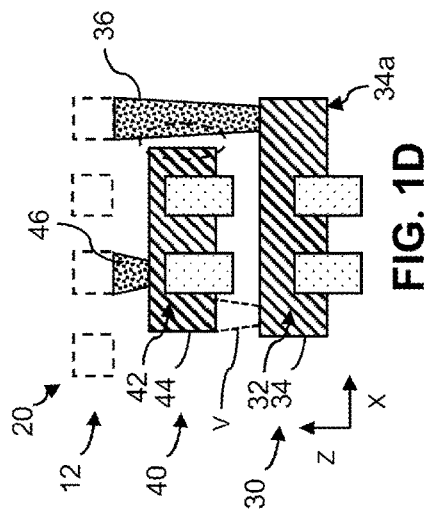
FIG. 1D schematically illustrates a comparative example of a circuit cell comprising a CFET device, according to example embodiments.

FIG. 1A is a schematic top-view of a circuit cell 10. FIGS. 1B and 1C are cross-sectional views of the circuit cell 10 along the plane A and B respectively, as indicated in FIG. 1A. FIGS. 1B and 1C are oriented sideways to facilitate association with the corresponding elements in FIG. 1A. FIG. 1D shows a part of the circuit cell 10 along the same plane as FIG. 1B in a normal or bottom-up orientation. Axes X and Y indicate a pair of transverse horizontal directions and axis Z indicates a vertical direction.

The circuit cell 10 comprises a CFET device 20 comprising a bottom device 30 (e.g. a PMOSFET) and a top device 40 (e.g. an NMOSFET). The bottom device 30 and the top device 40 each comprise a pair of channel nanostructures in the shape of a pair of fins 32 and 42 extending in parallel along direction Y.

The bottom device 30 comprises a bottom gate electrode 34 extending across the fins 32 in the X direction to define a tri-gate with respect to each of the fins 32. Correspondingly, the top device 40 comprises a bottom gate electrode 44 extending across the fins 42 to define a tri-gate with respect to each of the fins 42. The bottom and top device 30, 40 with physically separate bottom and top gate electrodes 34, 44 may be formed using a sequential process. The CFET device 20 may in other words form a sequential CFET device 20.

The cell 10 is a 4T cell comprising four routing tracks 12 uniformly spaced apart along direction X and extending in parallel along direction Y. The pitch of the routing tracks 12 substantially corresponds to the pitch of the fins 32, 42. The dashed lines extending in the Y direction represent boundaries of the cell 10, along the cell height direction X.

As shown in FIG. 1C, the source/drains 48 of the top device 40 may be tapped to a buried power rail 14 while the source/drains 38 of the bottom device 30 may be tapped to a metal line of one of the routing tracks 12.

The two contact levels (2-level MOL) provided by the CFET device 20 enables a reduced routing layer usage and the CFET device 20 is hence an enabler for low track height cells, in particular 4T cells. A considerable number of standard cells of a 4T standard cell library may be constructed based on a CFET device having electrically common top and gate electrodes. In a sequential CFET device, like the CFET device 20, electrically common top and gate electrodes may be provided using a short gate-to-gate via, schematically indicated with dashed outline V in FIG. 1D. However, some standard cells, in particular sequential cells including a tri-state/transmission-gate subcircuit may include electrically independent gates of the bottom and top device 30, 40 to avoid an area penalty. As highlighted in the encircled region of FIGS. 1B and 1D, a separate coupling via 36 to the bottom gate electrode 34 may however be challenging to realize due to the presence of the top gate electrode 44 overlapping the bottom gate electrode 34. Further, there may not be space available to extend a side gate portion 34a of the bottom gate electrode 34 along direction X sufficiently to allow a via 36 to couple to the bottom gate electrode 34 without shorting with a side gate portion of the top gate electrode 44. As may be appreciated, this issue may be especially pronounced in low track height cells and at aggressive line pitches. An option could be to reduce the number of fins 42 in the top device 40, to allow a side gate portion with a smaller extension (along direction X). However, this would come at a cost of degraded performance of the top device 40.

Figure 2A:
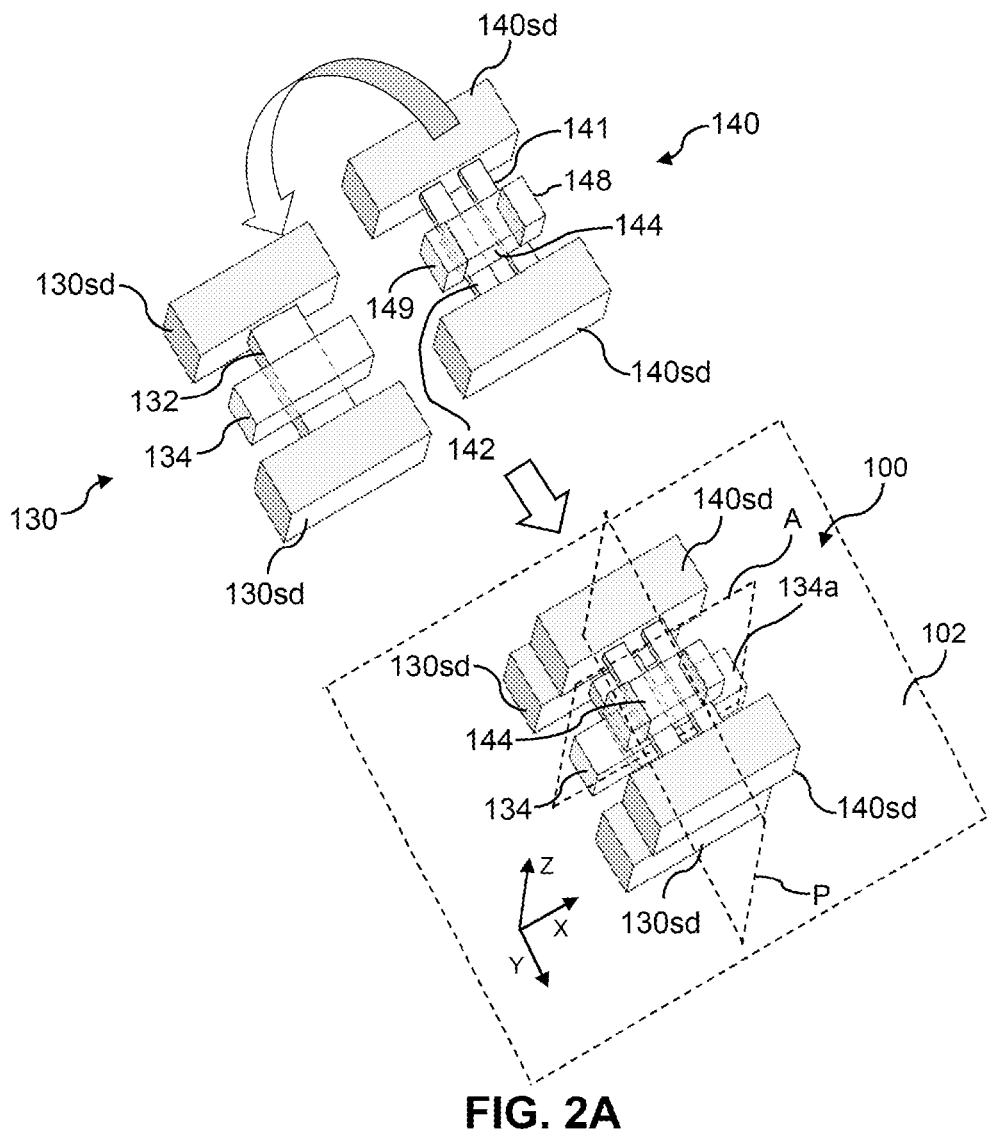
FIG. 2A schematically illustrates a CFET device, according to example embodiments.
Figure 2B:
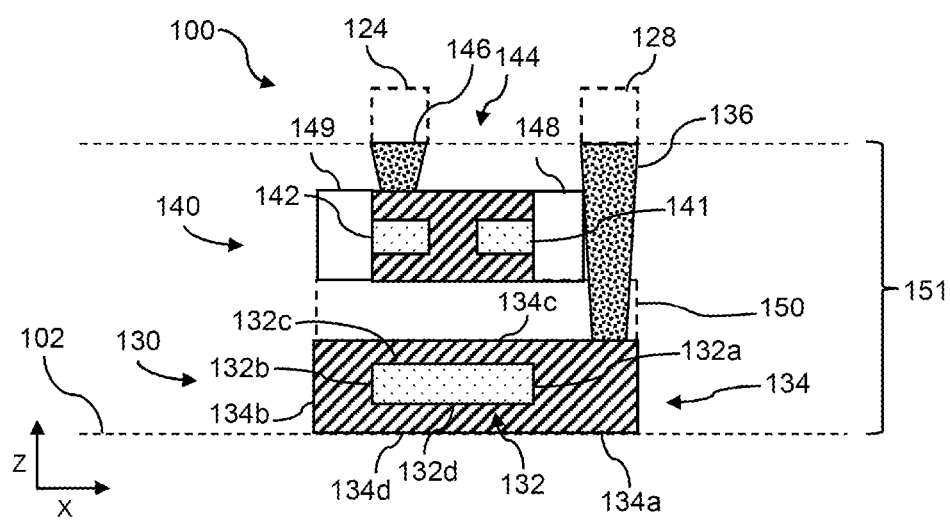
FIG. 2B schematically illustrates a CFET device, according to example embodiments.

Embodiments of a CFET device 100 will now be described with reference to FIGS. 2A-2C. In the figures axes X, Y and Z indicate a set of mutually transverse directions relative to a frame of reference of the device 100. Direction X denotes a first horizontal direction, Y denotes a third horizontal direction and Z denotes a vertical direction (e.g. corresponding to a bottom-up direction of the CFET device 100). The negative X direction (−X) denotes a second horizontal direction. FIG. 2A shows conceptual perspective views of the CFET device 100 and FIG. 2B illustrates a cross-sectional view of the CFET device 100 taken along a vertical plane A indicated in FIG. 2A (parallel to the XZ-plane).

The CFET device 100 comprises a bottom FET device 130 and a top FET device 140. The bottom FET device 130 and the top FET device 140 may in the following for brevity be denoted bottom device 130 and top device 140, respectively. As conceptually depicted in FIG. 2A, the top device 140 is stacked on top of the bottom device 130. The bottom device 130 defines a bottom level or bottom tier of the CFET device 100 and the top device 140 defines a top level or top tier of the CFET device 100. The bottom device 130 may e.g. be a p-type FET and the top device 140 may be an n-type FET, or vice versa.

The bottom device 130 and the top device 140 may be separated from each other by a dielectric layer 150 arranged intermediate the bottom and top device 130, 140. The dielectric layer 150 may as indicated in FIG. 2B be formed by a sub-layer or thickness portion of a dielectric layer structure 151 of the CFET device 100, embedding and covering the bottom and top device 130, 140. The dielectric layer structure 151 may be formed of one or more deposited layers of one more inter-layer dielectric materials, e.g. $SiO_2$ and/or other conventional inter-layer dielectric materials.

The CFET device 100 may as shown be arranged on a substrate 102. The substrate 102 may be a semiconductor substrate, i.e. a substrate comprising at least one semiconductor layer, e.g. of Si, SiGe or Ge. The substrate 102 may be a single-layered semiconductor substrate, for instance formed by a bulk substrate. A multi-layered/composite substrate 102 is however also possible, such as an epitaxially grown semiconductor layer on a bulk substrate, or a semiconductor-on-insulator (SOI) substrate.

The bottom device 130 comprises a bottom channel nanostructure in the form of a nanosheet 132 and a bottom gate electrode 134. The bottom channel nanosheet 132 extends in the Y direction between a source and a drain region (commonly referenced first and second source/drain regions 130sd) of the bottom device 130, located on opposite sides of the bottom gate electrode 134.

The top device 140 comprises a pair of channel layers in the form of a first channel nanosheet 141 and a second channel nanosheet 142. The top device 140 comprises a top gate electrode 144. The first and second channel nanosheets 141, 142 are spaced apart along the X direction and extend in the Y direction between a source and a drain region (commonly referenced first and second source/drain regions 140sd) of the top device 140, located on opposite sides of the top gate electrode 144. The channel nanosheets 141, 142 are each horizontally oriented, i.e. parallel to the substrate 102.

The top device 140 is stacked on top of the bottom device 130 such that the first source/drain region 140sd of the top device 140 is arranged directly above the first source/drain region 130sd of the bottom device 130, and the second source/drain regions 140sd of the top device 140 is arranged directly above the second source/drain region 130sd of the bottom device 130. The bottom and top devices 130, 140 are as shown aligned with respect to each other such that the bottom channel nanostructure 132, the source and drain regions 130sd, the bottom gate electrode 134, the source and drain regions 140sd and the top gate electrode 144 intersect a common (geometrical) vertical plane P. The first and second channel layers 141, 142 may be located at laterally opposite sides of the vertical plane P.

The nanosheets 132, 141, 142 of the bottom and top devices 130, 140 may be formed of a semiconductor material such as group IV semiconductors, e.g. Si, Ge, SiGe. However also other materials are possible such as group III-V (e.g. InP, InAs, GaAs, GaN) semiconductors. The source/drain regions 130sd, 140sd may comprise doped semiconductor material (e.g. Si, Ge, SiGe), e.g. epitaxially grown on the nanosheets 132, 141, 142 or formed by doped portions of the nanosheets 132, 141, 142. The source/drain regions 130sd, 140sd may further comprise electrode material, e.g. deposited on the doped semiconductor material. Example electrode materials include conventional barrier metals such as Ta, TiN or TaN, and conventional fill metals such as W, Al, Ru, Mo or Co.

The bottom and top gate electrodes 134, 144 of the bottom and top devices 130, 140 may be formed of metal. Example metals include one or more gate work function metal (WFM) layers and/or a gate electrode fill layer. Example gate WFMs include conventional n-type and p-type effect WFM metals, such as TiN, TaN, TiAl, TiAlC or WCN, or combinations thereof. Example gate fill materials include W and Al. A gate dielectric layer (not shown) may be provided on the top and bottom nanosheets 132, 142, between the respective nanosheet 132, 141, 142 and gate electrode 134, 144. Example gate dielectrics include conventional gate dielectrics, e.g. of a high-k such as $HfO_2$, LaO, AlO and ZrO.

The bottom channel nanosheet 132 of the bottom device 130 is horizontally oriented, i.e. parallel to the substrate 102. The nanosheet 132 has a first side surface 132a oriented in a first horizontal direction (e.g. the X direction) and a second side surface 132b oriented in the opposite second horizontal direction (e.g. the −X direction). The nanosheet 132 further has an upper surface 132c oriented in an upward direction (e.g. the Z direction) and a lower surface 132d oriented in a downward direction (e.g. the −Z direction).

The bottom gate electrode 134 is configured to define a gate-all-around (GAA) with respect to the nanosheet 132. The bottom gate electrode 134 comprises a first side gate portion 134a arranged along the first side surface 132a, a second side gate portion 134b arranged along the second side surface 132b, an upper gate portion 134c arranged along the upper surface 132c, and a lower gate portion 134d arranged along the lower surface 132d.

Figure 2C:
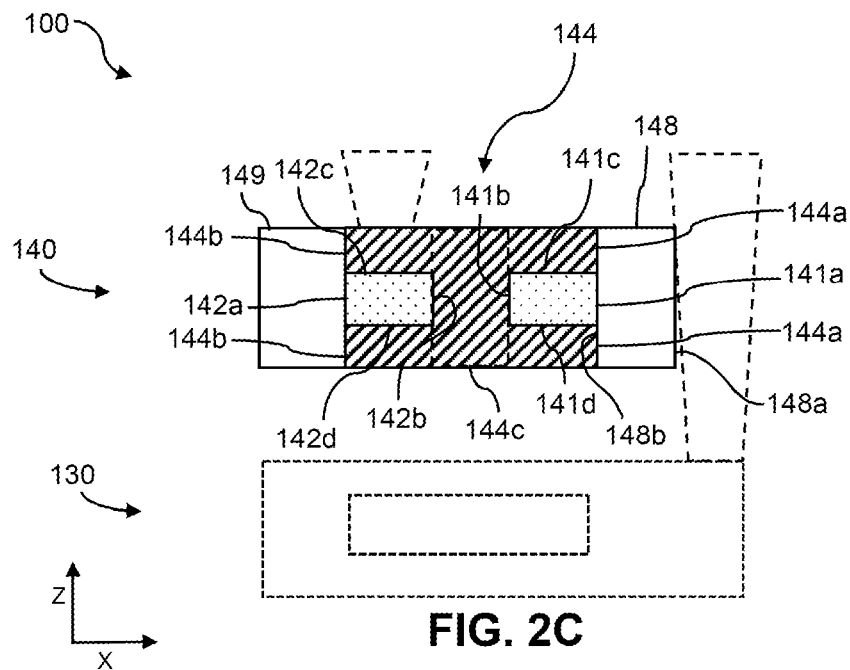
FIG. 2C schematically illustrates a CFET device, according to example embodiments.

FIG. 2C corresponds to FIG. 2B however depicts the top device 140 in a slightly enlarged view. As shown in FIG. 2C, the first channel nanosheet 141 has a first side surface 141a oriented in the first horizontal direction (e.g. the X direction) and a second side surface 141b oriented in the opposite second horizontal direction (e.g. the −X direction). The first channel nanosheet 141 further has an upper surface 141c oriented in an upward direction (e.g. the Z direction) and a lower surface 141d oriented in a downward direction (e.g. the −Z direction). The second channel nanosheet 142 has a first side surface 142a oriented in the second horizontal direction (e.g. the −X direction) and a second side surface 142b oriented in the opposite first horizontal direction (e.g. the X direction). The second channel nanosheet 142 further has an upper surface 142c oriented in an upward direction (e.g. the Z direction) and a lower surface 142d oriented in a downward direction (e.g. the −Z direction). The first side surface 141a may also be referred to as an outwardly facing side surface of the first channel nanosheet 141 and the second side surface 141 may be referred to as an inwardly facing side surface of the first channel nanosheet 141. Correspondingly, the first side surface 142a may be referred to as an outwardly facing side surface of the second channel nanosheet 142 and the second side surface 142 may be referred to as an inwardly facing side surface of the second channel nanosheet 142.

The top gate electrode 144 is configured to define a tri-gate with respect to each of the channel nanosheets 141, 142. The top gate electrode 144 comprises a common gate portion 144c arranged between the first and second channel nanosheets 141, 142. The common gate portion 144c is arranged along the respective second side surface 141b, 142b of the first and second channel nanosheet 141, 142.

The top gate electrode 144 comprises a pair of first gate prongs 144a protruding from the common gate portion 144c in the first direction (e.g. the X direction) such that the first channel nanosheet 141 is arranged between the first gate prongs 144a. An upper one of the first gate prongs 144a is arranged along the upper surface 141c of the first channel nanosheet 141. A lower one of the first gate prongs 144a is arranged along the lower surface 141d of the first channel nanosheet 141.

The top gate electrode 144 further comprises a pair of second gate prongs 144b protruding from the common gate portion 144c in the second direction (e.g. the −X direction) such that the second channel nanosheet 142 is arranged between the second gate prongs 144b. An upper one of the second gate prongs 144b is arranged along the upper surface 142c of the second channel nanosheet 142. A lower one of the second gate prongs 144b is arranged along the lower surface 142d of the second channel nanosheet 142.

The CFET device 100 further comprises a top gate contact via 146 and a bottom gate contact via 136 (shown in FIGS. 2B and 2C). The top gate contact via 146 is provided for coupling the top gate electrode 144 to a first conductive line 124 over the top device 140. The bottom gate contact via 136 is provided for coupling the bottom gate electrode 134 to a second conductive line 128 over the top device 140. As will be further described herein, the first and second conductive lines 124, 128 may e.g. form part of an interconnect layer arranged over the top device 140. In particular the first and second conductive lines 124, 128 may be arranged along respective routing tracks of a circuit cell of an integrated circuit.

Due to the tri-gate configuration of top gate electrode 144 with respect to the first channel nanosheet 141, the top gate electrode 144 presents a zero-gate extension along the first side surface 141a of the channel nanosheet 141, such that the first side surface 141a defines a non-gated side surface. Hence, while the top gate electrode 144 is arranged directly above the bottom gate electrode 134 such that the top gate electrode 144 partially overlaps the bottom gate electrode 134 (e.g. as viewed along the Z direction), the zero-gate extension allows the side gate portion 134a of the bottom gate electrode 134 to defines a via contact portion protruding outside the top gate electrode 144 and the non-gated first side surface 141a of the first channel nanosheet 141. The via contact portion defined by the side gate portion 134a is hence laterally offset or displaced (along the X direction) with respect to the top device 140, in particular with respect to the first channel nanosheet 141 and the top gate electrode 144. This creates a space for the bottom gate contact via 136 contacting the via contact portion defined by the side gate portion 134a of the bottom gate electrode 134. The bottom gate contact via 136 may as shown extend in a top-down direction (e.g. −Z direction) past the non-gated first side surface 141a of the first channel nanosheet 141 and the top gate electrode 144 and through the dielectric layer structure 151 and the dielectric layer 150 to contact the via contact portion of the bottom gate electrode 134.

As shown in FIGS. 2A-2C, the CFET device 100 may further comprise a vertically oriented (first) insulating wall 148 arranged alongside the top device 140, at a location between the top device 140 and the bottom gate contact via 136. As shown in FIG. 2C, the insulating wall 148 has a first side surface 148a oriented in the X direction and a second side surface 148b oriented in the −X direction. The bottom gate contact via 136 is aligned with the first side surface 148a of the insulating wall 148. The first side surface 141a of the first channel nanosheet 141 abuts the second side surface 148b. The insulating wall 148 may thus physically and electrically separate the bottom gate contact via 136 from the free ends of the first gate prongs 144a and the first side surface 141a of the first channel nanosheet 141.

The insulating wall 148 may be formed of a dielectric material different from the one or more materials of the dielectric layer structure 151. This allows the via hole for the bottom gate contact via 136 to be etched in the dielectric layer structure 151, selectively to and thus self-aligned with the insulating wall 148. The insulating wall 148 may further facilitate defining the first side surface 141a of the first channel nanosheet 141 as a non-gated surface, by forming the insulating wall 148 prior to gate formation.

The CFET device 100 may as further shown comprise an oppositely disposed vertically oriented (second) insulating wall 149, arranged alongside the opposite side of the top gate electrode 144. The top gate electrode 144 may accordingly be arranged between the insulating walls 148, 149. The insulating wall 149 may be formed of a same material as the insulating wall 148 and may similar to the insulating wall 148 facilitate defining the first side surface 142a of the second channel nanosheet 142 as a non-gated surface.

In FIG. 2B the free ends of the first pair of gate prongs 144a are schematically shown to be exactly aligned with the first side surface 141a of the first channel nanosheet 141. As may be appreciated, this is however merely a schematic depiction and an exact alignment is typically not to be expected in a physical realization of the CFET device 100. For example, if the insulating wall 148 is formed prior to gate formation, one or more layers of gate dielectric may be present between the free ends of the gate prongs 144a and the second side surface 148b of the insulating wall 148, such that the free ends of the gate prongs 144a are recessed with respect to the first side surface 141 of the first channel nanosheet 141. However, even in such a case, the top gate electrode 144 may be configured to function as a tri-gate with respect to the first channel nanosheet 142. This discussion applies correspondingly to the second pair of gate prongs 144b and the first side surface 142a of the second channel nanosheet 142.

In the illustrated embodiment, the first and second channel nanosheets 141, 142 are arranged above the channel nanosheet 132 such that the first side surface 132a of the channel nanosheet 132 is aligned with the first side surface 141a of the first channel nanosheet 141 and the second side surface 132b of the channel nanosheet 132 is aligned with the first side surface 142a of the second channel nanosheet 142. Such a configuration may contribute to an area efficient design and a more uniform electric performance of the bottom and top device 130, 140. As may be appreciated, an exact alignment between the channel nanosheets 132, 141, 142 of the bottom and top devices 130, 140 may however in practice be difficult to achieve with a high yield (e.g. due to process variations) and is in any case not a requirement. Indeed, the increased space for the bottom gate contact via 136 provided in the CFET device 100, may increase a margin towards mis-alignment between the side surfaces of the channel nanosheets 132 and 141.

Figure 3:
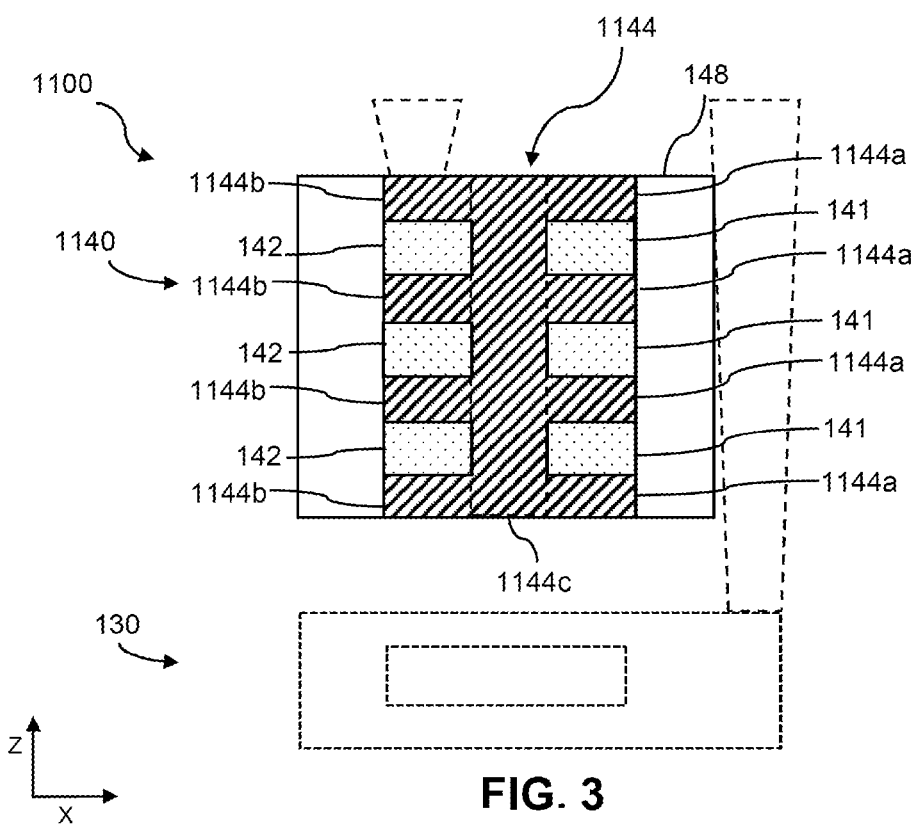
FIG. 3 schematically illustrates a CFET device, according to example embodiments.

FIG. 3 depicts a CFET device 1100 according to a further embodiment. FIG. 3 is a cross-sectional view corresponding to the cross-section in FIGS. 2B and 2C. The CFET device 1100 is similar to the CFET device 100 and differs only in that the top device 1140 comprises a plurality of first channel nanosheets 141 vertically spaced apart and stacked on top of each other and a same number of second channel nanosheets 142 vertically spaced apart and stacked on top of each other. Additionally, top gate electrode 1144 comprises a number of pairs first gate prongs 1144a protruding from a common gate portion 1144c in the first horizontal direction (e.g. the X direction) and a same number of pairs of second gate prongs 1144b protruding from the common gate portion 1144c in the second horizontal direction (e.g. the −X direction).

The illustrated example shows three first and second channel nanosheets 141, 142. This is however merely an example and a CFET device may also comprise only two, or more than three first and second channel nanosheets 141, 142. The number of first and second gate prongs 1144a, 1144b may be varied in accordance with the number of nanosheets 141, 142 such that each nanosheet 141, 142 may be arranged between a respective pair of gate prongs.

It is further contemplated that the bottom device 130 may comprise a number of channel nanosheets, such as two or more channel nanosheets vertically spaced apart and stacked above each other.

A greater number of channel nanosheets in the top and/or bottom device may enable an increased drive current although at a cost of an increased device height.

Figure 4:
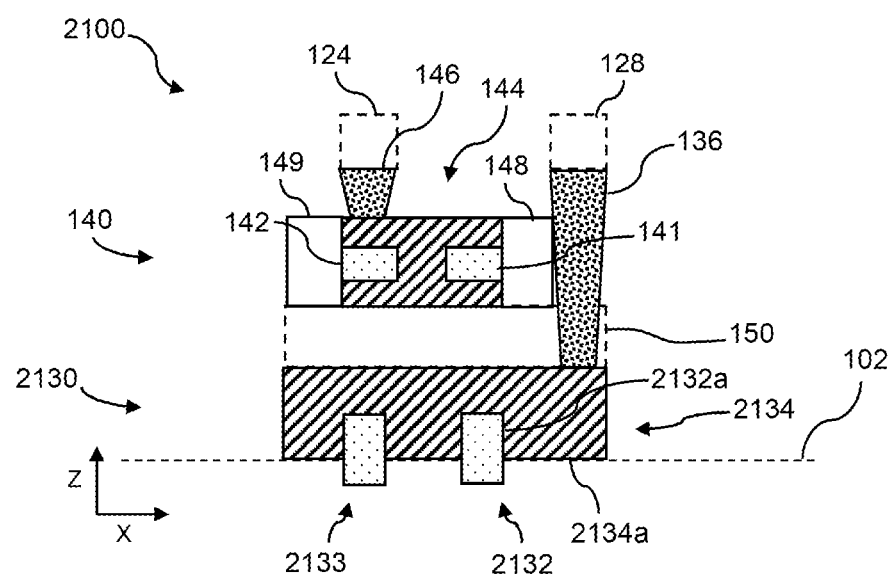
FIG. 4 schematically illustrates a CFET device, according to example embodiments.

FIG. 4 depicts a CFET device 1100 according to a further embodiment. FIG. 4 is a cross-sectional view corresponding to the cross-section in FIG. 2B. The CFET device 2100 is similar to the CFET device 100 and differs only in that the bottom device 2130 comprises a pair of channel nanostructures in the form of a pair of a first and second semiconductor fin structure 2132, 2133, instead of the nanosheet 132. The second fin structure 1133 extends in parallel to the first fin structure 1132. The first channel nanosheet 141 may as shown be arranged directly above the first fin structure 1132, and thus overlap the same, as viewed along the Z direction. The second channel nanosheet 142 may correspondingly as shown be arranged directly above the second fin structure 1133, and thus overlap the same, as viewed along the Z direction.

The bottom gate electrode 2134 extends across the first and second fin structures 2132, 2133 to define a tri-gate with respect to each of the fin structures 2132, 2133. More specifically, the side gate portion 2134 of the bottom gate electrode 2134 is arranged along a first side surface 2132a of the first fin structure 2132 and defines a via contact portion protruding outside the top gate electrode 144 and the (non-gated) first side surface 142a of the first channel nanosheet 141. As discussed above, this creates a space for the bottom gate contact via 136 to contact the via contact portion 2134a of the bottom gate electrode 2134.

Although FIG. 4 depicts a pair of fin structures 2132, 2133 it is possible to provide a bottom device 2130 comprising only a single fin structure, or more than two fin structures. For instance, an increased width or separation of the first and second channel nanosheets 141, 142 and/or a tighter fin spacing may allow for accommodating three or more fin structures within the combined footprint of the first and second channel nanosheets 141, 142.

The CFET devices 100, 1100 and 2100 may be sequential CFET devices, e.g.

CFETs formed in a sequential process using standard techniques. By way of example, forming the bottom device 130, 2130 may comprise forming channel nanostructures by patterning a nanosheet or a stack of nanosheets (in the case of a nanosheet-based bottom device like bottom device 130) or a fin-shaped channel nanostructure (in the case of a fin-based bottom device like bottom device 2130) in one or more semiconductor layers; forming dummy gates across the channel nanostructures; defining source/drain regions on either side of the dummy gates by epitaxy and/or ion implantation; replacing the dummy gates with functional gates (e.g. comprising gate dielectric and gate metal). The bottom device 130, 2130 may subsequently be covered by one or more dielectric layers (e.g. dielectric layer 150 of the dielectric layer structure 151) and any further interfacial layers e.g. to facilitate a subsequent bonding step. The top device 140, 1140 may then be formed by bonding a substrate on top of the bottom device 130, 2130 (e.g. comprising one or more semiconductor layers) and thereafter forming the top device 140, 1140 in a manner similar to the bottom device 130, 2130 (e.g. patterning a nanosheet or a stack of nanosheets in the one or more semiconductor channel layers, etc.). The tri-gate configuration of the top gate electrode 144, 1144 may be achieved e.g. by cutting away portions of the dummy gate extending past the respective first side surface 141a, 142a of the first and second channel nanosheets 141, 142 (e.g. using a dummy gate etch) and replace the removed portions with a respective insulating wall (e.g. insulating walls 148, 149), prior to the gate replacement step. It is also possible to cut away portions of the metal gate electrode extending past the first side surfaces 141a, 142a (e.g. using a gate metal etch/cut), subsequent to a dummy gate replacement step. According to a further example, insulating walls (e.g. insulating walls 148, 149) may be formed in connection with the patterning of the nanosheets, e.g. by patterning respective trenches and filling the trenches with an insulating wall material. The insulating walls may subsequently be used to counteract deposition of gate material, e.g. during a dummy gate replacement step. If the channel nanostructure is a nanosheet (e.g. like in the bottom device 130 and the top device 140) the fabrication may further comprise a step of channel nanosheet release, performed as a sub-step within the replacement metal gate process, comprising removing sacrificial layers below and on top of the channel nanosheet to expose the upper and lower surfaces of the channel nanosheet ahead of the gate dielectric and gate metal deposition.

FIGS. 5A-5D schematically illustrate an embodiment of a circuit cell 200 comprising the CFET device 100. Although the illustrated circuit cell 200 comprises the CFET device 100, it is equally possible to replace the CFET device 100 by the CFET device 1100 or 2100. The views in FIGS. 5A-5D generally correspond to those of FIGS. 1A-1D. The circuit cell 200 comprises an interconnect layer 120 arranged over the top FET device 140 and comprising the first and the second conductive line 124, 128.

The circuit cell 200 is a 4T cell including electrically independent gates of the bottom and top device 130, 140, for example a sequential standard cell of a standard cell library, including a tri-state/transmission-gate subcircuit. The circuit cell 200 may however also implement some other functionality such as a memory cell.

The cell 200 comprises four routing tracks: two edge tracks T1, T4 and two non-edge or inner tracks T2, T3. The routing tracks T1-T4 are uniformly spaced apart along direction X and extend in parallel along direction Y. The dashed lines extending in the Y direction represent boundaries of the cell 200, along the cell height direction X.

The conductive line 124 is arranged to extend along track T2 which is arranged directly above the top gate electrode 144. The top gate contact via 146 extends vertically between the conductive line 124 and the top gate electrode 144 to electrically couple the conductive line 124 to the top gate electrode 144.

The conductive line 128 is arranged to extend along track T4 which is arranged directly above the via contact portion defined by the side gate portion 134a. In other words, the side gate portion 134a of the bottom gate electrode 134 protrudes in the X direction such that the via contact portion is positioned directly underneath track T4 and the conductive line 128. The bottom gate contact via 136 extends vertically between the conductive line 128 and the via contact portion to electrically couple the conductive line 128 to the bottom gate electrode 134.

As may be appreciated, the length of the gate extension of the bottom gate electrode 134, i.e. the via contact portion, along the X-direction (denoted L in FIG. 5D) may be in a range of 8-10 nm. A spacing of the routing tracks T1-T4 may be of a corresponding dimension. A gate extension of 8-10 nm corresponds approximately to 1 critical dimension (CD) for current gate cut processes and is compatible with the N2 technology node.

In the illustrated embodiment the conductive line 124 is arranged along track T2, directly above the second channel nanosheet 142 (and the second gate prongs 144b shown in FIG. 2B). However, it is contemplated that the conductive line 124 also may be arranged along track T3, directly above the first channel nanosheet 141 (and the first gate prongs 144a shown in FIG. 2A). Arranging the conductive line 124 along either of the non-edge tracks T2 or T3 may allow the edge track T1 to be used for power rails for the CFET device 100.

FIG. 5C depicts an example of signal routing to the respective source/drain regions 130sd, 140sd of the bottom and top devices 130, 140. The source/drain region 130sd of the bottom device 130 may as shown be coupled to a conductive line extending along track T1 while source/drain region 140sd of the top device 140 may be coupled to the source drain region 130sd by a via 138 extending between the top and bottom device 130, 140. A corresponding signal routing may be implemented at the source/drain regions at the opposite sides of the channels. This however merely represents one of numerous examples for signal routing to the source/drain regions. For example, as further indicated in FIGS. 5A-5C, buried power rails 114 may be embedded in the substrate 102. The buried power rails 114 may extend along the boundaries of the cell 200. The buried power rails 114 may provide additional routing resources without introducing further congestion in interconnect levels above the CFET device 100. For example, the via 139 coupled to the source/drain region 130sd may be replaced with a via (via 139a indicated by dashed lines in FIG. 4C) coupled to a buried power rail 114.

Figure 6:
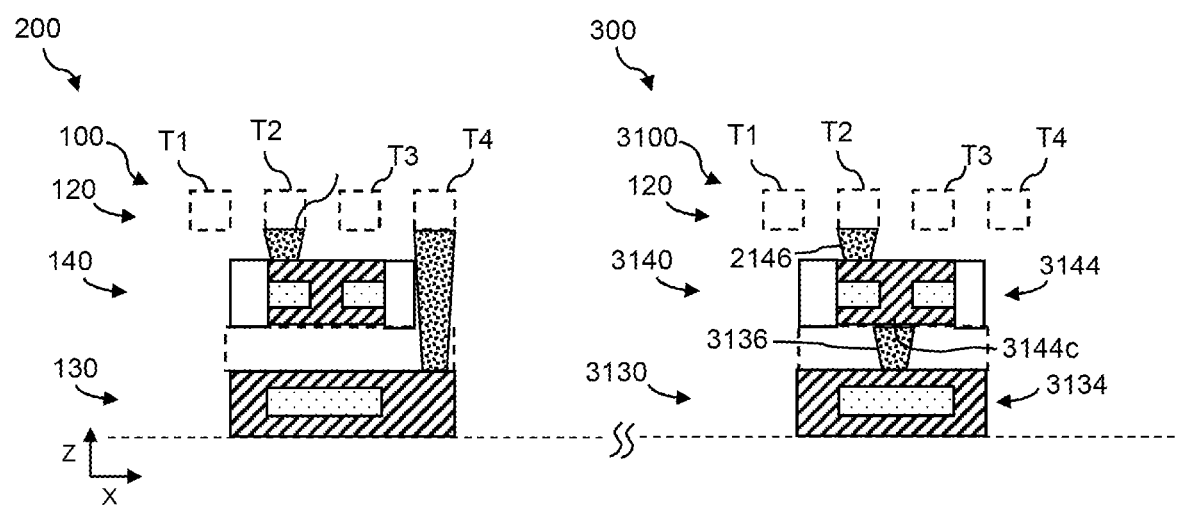
FIG. 6 schematically illustrates an integrated circuit, according to example embodiments.

FIG. 6 schematically illustrates an embodiment of an integrated circuit comprising a plurality of first circuit cells corresponding to circuit cell 200 (or alternatively a circuit cell comprising CFET device 1100 or 2100) and a plurality of second circuit cells 300 comprising a CFET device 2100 (e.g. a sequential CFET) comprising a bottom device 3130 and a top device 3140. The bottom device 3130 has a configuration corresponding to bottom device 130. The top device 3140 has a configuration corresponding to top device 140. The CFET device 3100 however differs from the CFET device 100 in that the common gate portion 3144c of the top gate electrode 3144 is coupled to the bottom gate electrode 3134 by a bottom gate contact via 3136. The top gate electrode 3144 may further be coupled to a conductive line arranged along a track, e.g. track T2, by a top gate contact via 3146. The bottom gate electrode 3134 and the top gate electrode 3144 may hence be connected to a common conductive line, the bottom gate electrode 3134 being connected to the conductive line through the via 3146, the common gate portion 3144c and the bottom gate contact via 3136. In the illustrated embodiment, the bottom device 3130 is a nanosheet-based device, however, it is also possible to configure the bottom device 3130 as a fin-based device corresponding to bottom device 2130. In any case, the centrally located common gate portion 3144 of the top gate electrode 3144 enables electrically connected top and bottom gate electrodes without requiring any increased side gate extension for the bottom gate electrode.

FIG. 6 shows only cross-sectional views of the respective circuit cells 200, 300 corresponding to the view in FIG. 5D (i.e. through the channels and gates) to highlight the different connection approaches for the bottom and top gate electrodes. The circuit cell 300 may otherwise have a layout similar to the circuit cell 200 as shown in FIGS. 4A-4D. In any case, FIG. 6 illustrates that CFET based circuit cells with independent gate pick-up and electrically common gates may be combined in a same integrated circuit.

In the above, a limited number of examples have been described. However, as is readily appreciated, other examples than the ones disclosed above are equally possible within the scope of the disclosure, as defined by the appended claims.

What is claimed is:

1. A complementary field-effect transistor (CFET) device comprising:
   a bottom FET device of a first conductivity type comprising:
   a bottom channel nanostructure having a first side surface oriented in a first direction;
   a second side surface oriented in a second direction opposite the first direction; and
   a bottom gate electrode configured to define a tri-gate or a gate-all-around with respect to the bottom channel nanostructure, wherein the bottom gate electrode comprises a side gate portion arranged along the first side surface of the bottom channel nanostructure;
   a top FET device of a second conductivity type stacked on top of the bottom FET device in a direction perpendicular to the first direction, wherein the first conductivity type and the second conductivity type are opposite and the top FET device comprises:
   a first channel layer;
   a second channel layer spaced apart along the first direction;
   a top gate electrode configured to define a tri-gate with respect to each of the first and second channel layers, wherein the top gate electrode comprises a common gate portion arranged between the first channel layer and the second channel layer;
   a pair of first gate prongs protruding from the common gate portion in the first direction such that the first channel layer is arranged between the first gate prongs; and
   a pair of second gate prongs protruding from the common gate portion in the second direction such that the second channel layer is arranged between the second gate prongs, wherein the side gate portion of the bottom gate electrode defines a via contact portion protruding outside the top gate electrode and the first channel layer of the top FET device;
   a top gate contact via for coupling the top gate electrode to a first conductive line over the top FET device; and
   a bottom gate contact via for coupling the via contact portion of the bottom gate electrode to a second conductive line over the top FET device.

2. The CFET device according to claim 1, further comprising a vertically oriented insulating wall arranged alongside the top FET device between the top FET device and the bottom gate contact via.

3. The CFET device according to claim 2, wherein the insulating wall has a first side surface oriented in the first direction and a second side surface oriented in the second direction, and wherein the bottom gate contact via is aligned with the first side surface of the insulating wall.

4. The CFET device according to claim 2, wherein the first channel layer has a first side surface oriented in the first direction and abutting the second side surface of the insulating wall.

5. The CFET device according to claim 1, further comprising a dielectric layer arranged between the bottom gate electrode and the top gate electrode, wherein the bottom gate contact via extends through the dielectric layer.

6. The CFET device according to claim 1, wherein the first channel layer of the top FET device is arranged directly above the bottom channel nanostructure.

7. The CFET device according to claim 1, wherein the bottom channel nanostructure comprises a nanosheet.

8. The CFET device according to claim 7, wherein the first channel layer and the second channel layer of the top FET device are arranged directly above the nanosheet.

9. The CFET device according to claim 7, wherein the bottom gate electrode is configured to define a gate-all-around with respect to the nanosheet.

10. The CFET device according to claim 1, wherein the bottom channel nanostructure comprises a first fin structure, and wherein the bottom gate electrode extends across the first fin structure to define a tri-gate with respect to the first fin structure.

11. The CFET device according to claim 10, wherein the bottom FET device further comprises a second fin structure arranged alongside the first fin structure, wherein the bottom gate electrode extends across the first fin structure and the second fin structure to define a tri-gate with respect to each of the first fin structure and the second fin structure, and wherein the first channel layer is arranged directly above the first fin structure and the second channel layer is arranged directly above the second fin structure.

12. The CFET device according to claim 1,
wherein the top FET device further comprises:
at least two vertically spaced apart first channel layers; and
at least two vertically spaced apart second channel layers, and
wherein the top gate electrode further comprises:
at least three first gate prongs protruding from the common gate portion in the first direction such that each first channel layer is arranged between a respective pair of first gate prongs; and
at least three second gate prongs protruding from the common gate portion in the second direction such that each second channel layer is arranged between a respective pair of second gate prongs.

13. A circuit cell comprising:
a complementary field-effect transistor (CFET) device comprising:
a bottom FET device of a first conductivity type comprising:
a bottom channel nanostructure having a first side surface oriented in a first direction;
a second side surface oriented in a second direction opposite the first direction; and
a bottom gate electrode configured to define a tri-gate or a gate-all-around with respect to the bottom channel nanostructure, wherein the bottom gate electrode comprises a side gate portion arranged along the first side surface of the bottom channel nanostructure;
a top FET device of a second conductivity type stacked on top of the bottom FET device in a direction perpendicular to the first direction, wherein the first conductivity type and the second conductivity type are opposite and the top FET device comprises:
a first channel layer;
a second channel layer spaced apart along the first direction;
a top gate electrode configured to define a tri-gate with respect to each of the first and second channel layers, wherein the top gate electrode comprises a common gate portion arranged between the first channel layer and the second channel layer;
a pair of first gate prongs protruding from the common gate portion in the first direction such that the first channel layer is arranged between the first gate prongs; and
a pair of second gate prongs protruding from the common gate portion in the second direction such that the second channel layer is arranged between the second gate prongs, wherein the side gate portion of the bottom gate electrode defines a via contact portion protruding outside the top gate electrode and the first channel layer of the top FET device;
a top gate contact via for coupling the top gate electrode to a first conductive line over the top FET device; and
a bottom gate contact via for coupling the via contact portion of the bottom gate electrode to a second conductive line over the top FET device; and
an interconnect layer arranged over the top FET device, wherein the interconnect layer comprises the first conductive line and the second conductive line, wherein the first conductive line of the interconnect layer is arranged to extend along a first routing track of the circuit cell, wherein the second conductive line of the interconnect layer is arranged to extend along a second routing track of the circuit cell, and wherein the first routing track and the second routing track extend in parallel along a third direction transverse to the first direction and the second direction.

14. The circuit cell according to claim 13, wherein the CFET device further comprises a vertically oriented insulating wall arranged alongside the top FET device between the top FET device and the bottom gate contact via.

15. The circuit cell according to claim 14, wherein the insulating wall has a first side surface oriented in the first direction and a second side surface oriented in the second direction, and wherein the bottom gate contact via is aligned with the first side surface of the insulating wall.

16. The circuit cell according to claim 14, wherein the first channel layer has a first side surface oriented in the first direction and abutting the second side surface of the insulating wall.

17. The circuit cell according to claim 13, wherein the CFET device further comprises a dielectric layer arranged between the bottom gate electrode and the top gate electrode, and wherein the bottom gate contact via extends through the dielectric layer.

18. The circuit cell according to claim 13, wherein the first channel layer of the top FET device is arranged directly above the bottom channel nanostructure.

19. The circuit cell according to claim 13, wherein the circuit cell is a 4-track cell, wherein the second routing track is an edge track, wherein the first routing track is located directly above the top gate electrode, and wherein the side gate portion of the bottom gate electrode protrudes in the first direction such that the via contact portion is positioned directly underneath the first edge track.

20. An integrated circuit comprising:
a plurality of first circuit cells, wherein each of the first circuit cells is in accordance with claim 13; and
a plurality of second circuit cells, wherein each of the second circuit cells comprises:
  a bottom FET device comprising:
    a bottom channel nanostructure; and
    a bottom gate electrode configured to define a tri-gate or a gate-all-around with respect to the bottom channel nanostructure; and
  a top FET device stacked on top of the bottom FET device, wherein the top FET device comprises:
    a first channel layer;
    a second channel layer spaced apart along the first direction; and
    a top gate electrode configured to define a tri-gate with respect to each of the first channel layer and the second channel layer, wherein the top gate electrode comprises:
      a common gate portion arranged between the first channel layer and the second channel layers;
      a pair of first gate prongs protruding from the common gate portion in the first direction such that the first channel layer is arranged between the first gate prongs; and
      a pair of second gate prongs protruding from the common gate portion in the second direction such that the second channel layer is arranged between the second gate prongs;
  a bottom gate contact via extending between the common gate portion and the bottom gate electrode to couple the top gate electrode to the bottom gate electrode; and
  a top gate contact via coupling the top gate electrode to a third conductive line.

* * * * *